(12) United States Patent
Kiyamura

(10) Patent No.: US 11,516,414 B2
(45) Date of Patent: Nov. 29, 2022

(54) IMAGING DEVICE AND METHOD OF CONTROLLING THE SAME

(71) Applicant: CANON KABUSHIKI KAISHA, Tokyo (JP)

(72) Inventor: Kosuke Kiyamura, Kawasaki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/926,134

(22) Filed: Jul. 10, 2020

(65) Prior Publication Data

US 2020/0344429 A1 Oct. 29, 2020

Related U.S. Application Data

(63) Continuation of application No. PCT/JP2018/045026, filed on Dec. 7, 2018.

(30) Foreign Application Priority Data

Jan. 12, 2018 (JP) .............................. JP2018-003578

(51) Int. Cl.
| | | |
|---|---|---|
| *H04N 5/353* | (2011.01) | |
| *H04N 5/355* | (2011.01) | |
| *H04N 5/235* | (2006.01) | |
| *H04N 5/343* | (2011.01) | |

(52) U.S. Cl.
CPC ......... *H04N 5/3535* (2013.01); *H04N 5/2352* (2013.01); *H04N 5/343* (2013.01); *H04N 5/35581* (2013.01)

(58) Field of Classification Search
CPC .... H04N 5/2352; H04N 5/343; H04N 5/3535; H04N 5/35581
See application file for complete search history.

(56) References Cited

U.S. PATENT DOCUMENTS

| | | | |
|---|---|---|---|
| 8,159,559 B2 | 4/2012 | Senba | |
| 9,986,182 B2 | 5/2018 | Miyake et al. | |
| 2010/0295953 A1* | 11/2010 | Torii | ......................... G06T 5/50 348/208.4 |
| 2012/0320236 A1* | 12/2012 | Toyoda | .................. H04N 5/772 348/231.99 |

(Continued)

FOREIGN PATENT DOCUMENTS

| | | |
|---|---|---|
| JP | 2001-197373 A | 7/2001 |
| JP | 2009-218893 A | 9/2009 |
| JP | 2013-121093 A | 6/2013 |

(Continued)

*Primary Examiner* — Daniel M Pasiewicz

(74) *Attorney, Agent, or Firm* — Cowan, Liebowitz & Latman, P.C.

(57) ABSTRACT

Provided is an imaging device in which a subject moving within a visual field can be freely expressed with a simple configuration. This imaging device is an imaging device which acquires an image by dividing one imaging period into a plurality of periods for exposure to add for each pixel, and includes an imaging element which includes a photoelectric conversion unit configured to generate a signal charge, and a control unit configured to control an accumulation time of the signal charge generated in the photoelectric conversion unit. The control unit changes the accumulation time in each period obtained by dividing the one imaging period.

13 Claims, 14 Drawing Sheets

(56) References Cited

U.S. PATENT DOCUMENTS

2015/0334304 A1\* 11/2015 Gavant ............... H04N 5/2353
                                                       348/208.1
2020/0177787 A1    6/2020 Satou et al.

FOREIGN PATENT DOCUMENTS

| JP | 2017-118595 A | 6/2017 |
| JP | 2017-216743 A | 12/2017 |

\* cited by examiner

IMAGING DEVICE AND METHOD OF CONTROLLING THE SAME

CROSS-REFERENCE TO RELATED APPLICATIONS

This application is a Continuation of International Patent Application No. PCT/JP2018/045026, filed Dec. 7, 2018, which claims the benefit of Japanese Patent Application No. 2018-003578, filed Jan. 12, 2018, both of which are hereby incorporated by reference herein in their entirety.

BACKGROUND OF THE INVENTION

Field of the Invention

The present invention relates to an imaging device and control method thereof, and more particularly to an imaging device having an imaging element for obtaining an image on the basis of time-divided exposure.

Background Art

In order to freely express a subject moving within a visual field of an imaging device, slow synchronous imaging is performed in which strobe light is emitted at a specific timing during slow shutter imaging. For example, as a kind of slow synchronous imaging, there is a so-called trailing-curtain synchronization imaging method in which strobe light is emitted immediately before a shutter is closed. With this imaging method, a subject image without blurring which is captured in a short time when strobe light is emitted and a motion blur image that is a trajectory of the subject before light is emitted can be overlaid and recorded in an image, and thus details, a trajectory, and a moving direction of the subject can be expressed at the same time. However, the slow synchronous imaging requires a stroboscope that can be synchronized with a shutter, and in addition, there is a problem that such an effect cannot be obtained for a distant subject that strobe light does not reach. Patent Literature 1 discloses an imaging device in which, by dividing an optical path using a spectroscopic unit and synthesizing images captured by a plurality of imaging elements having different exposure times, the same effects as those of the slow synchronous imaging can be obtained without a stroboscope.

CITATION LIST

Patent Literature

Patent Literature 1: Japanese Patent Laid-Open No. 2009-218893

However, in Patent Literature 1, a spectroscopic unit such as a beam splitter, a plurality of imaging elements having different exposure conditions, and an image synthesizing unit for synthesizing images output from the imaging elements are required, which complicates a configuration of the device.

In view of the above problems, an object of the present invention is to provide an imaging device in which a subject moving in a visual field can be freely expressed with a simple configuration.

SUMMARY OF THE INVENTION

An imaging device of the present invention is an imaging device which acquires an image by dividing one imaging period into a plurality of periods for exposure to add each pixel, and is characterized by including an imaging element which has a photoelectric conversion unit configured to generate a signal charge, and a control unit configured to control an accumulation time of the signal charge generated in the photoelectric conversion unit, in which the control unit changes the accumulation time in each period obtained by dividing the one imaging period.

According to the present invention, it is possible to provide an imaging device in which a subject moving in a visual field can be freely expressed with a simple configuration.

Further features of the present invention will become apparent from the following description of exemplary embodiments with reference to the attached drawings.

DESCRIPTION OF THE EMBODIMENTS

Figure 1B:
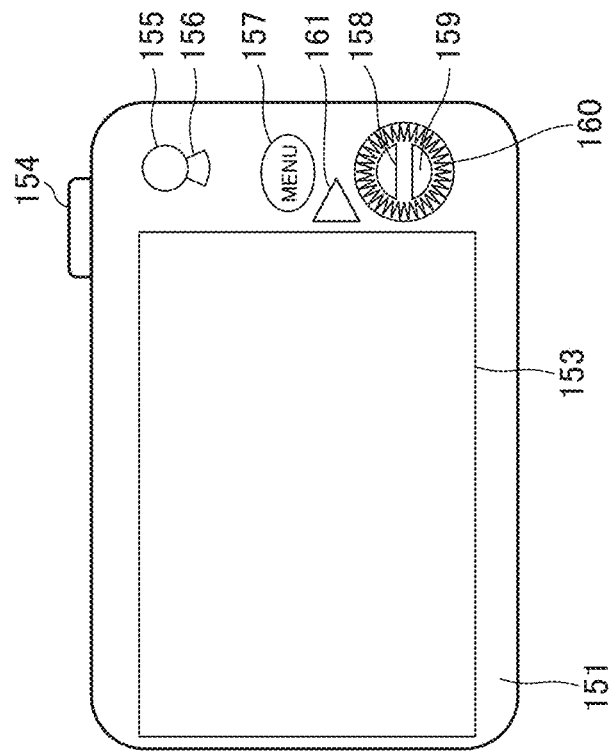
FIGS. 1A and 1B are external views of a digital still motion camera.

The best mode for carrying out the present invention will be described below with reference to the drawings. Also, in the drawings used in the following description, the same constituent components are designated by the same reference numerals.

First Embodiment

Figure 1A:
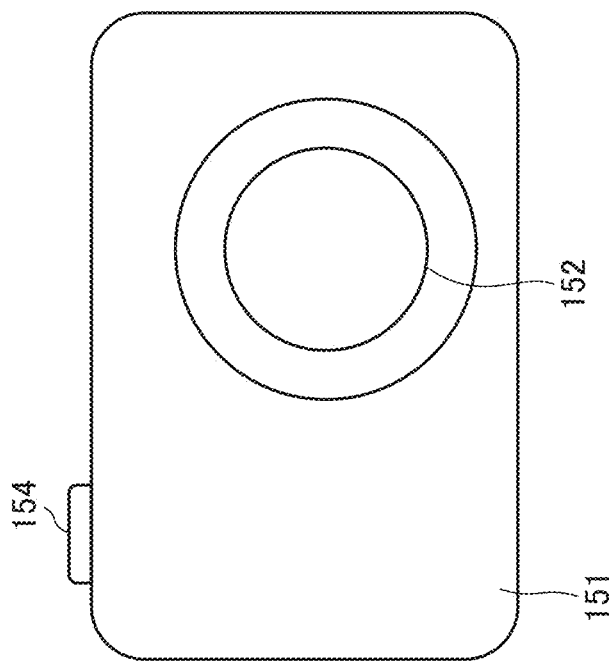

An imaging device according to the present embodiment, in which an imaging optical system for imaging and the like is added to an image processing device, will be described. FIGS. 1A and 1B are external views of a digital still motion camera that is an imaging device according to the present embodiment, in which FIG. 1A shows a front view of the imaging device, and FIG. 1B is a rear view of the imaging device. The imaging device according to the present embodiment includes an imaging device body 151 having an imaging element and a shutter device housed therein, an imaging optical system 152 having a diaphragm therein, and a movable display unit 153 for displaying imaging information and images. Also, the imaging device includes a switch ST 154 mainly used for imaging a still image, and a switch MV 155 which is a button for starting and stopping moving image imaging. The display unit 153 has a sufficient display luminance range in which an image with a wide dynamic range can also be displayed without inhibiting its luminance range. In addition, the imaging device includes an imaging mode selection lever 156 for selecting an imaging mode, a menu button 157 for shifting to a function setting mode in which setting of a function of the imaging device is performed, and up-down switches 158 and 159 for changing various setting values. Further, the imaging device includes a dial 160 for changing various setting values, and a reproduction button 161 for shifting to a reproduction mode in which an image recorded on a recording medium housed in the imaging device body is reproduced on the display unit 153.

Figure 2:
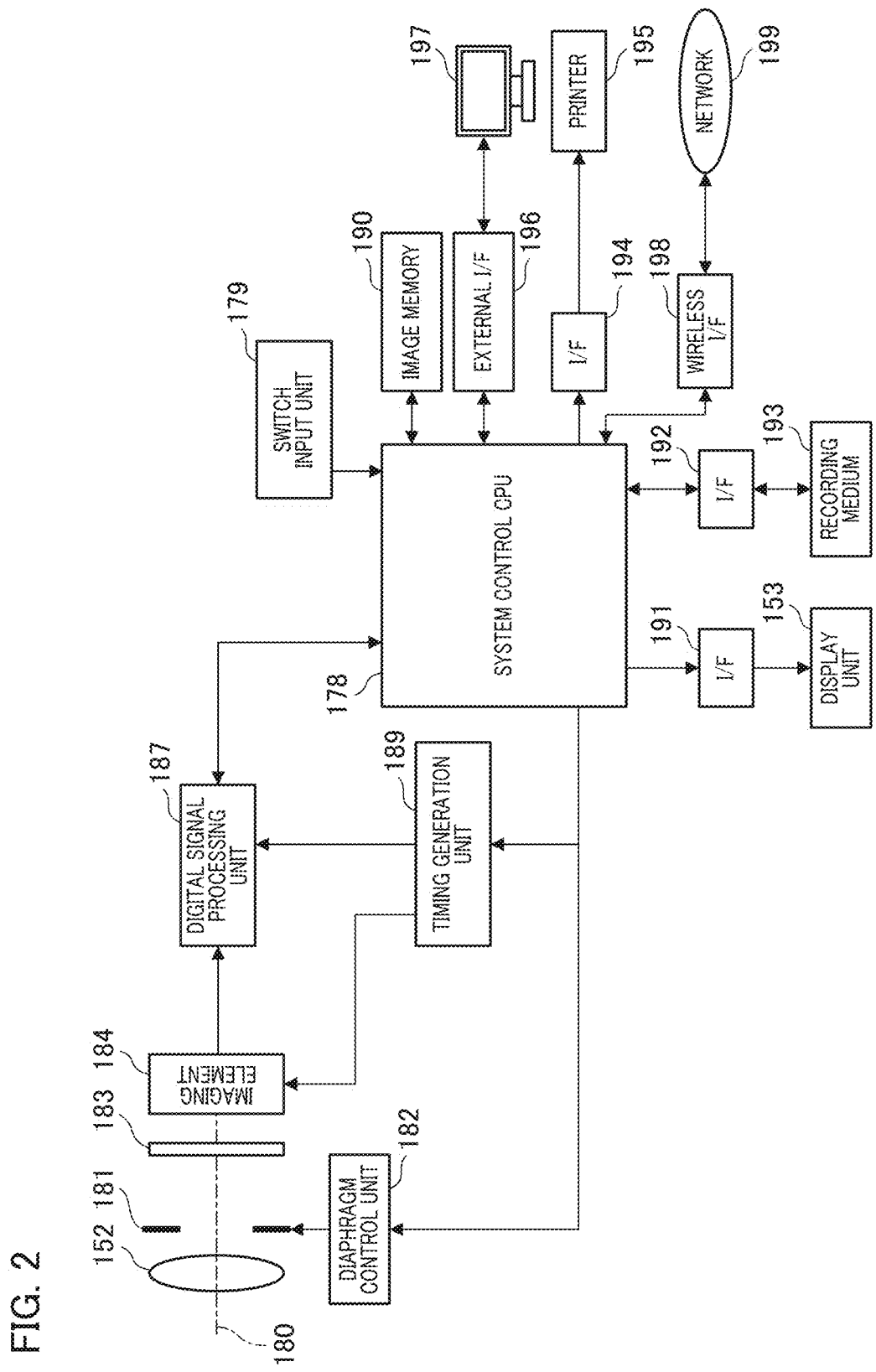
FIG. 2 is a block diagram showing a schematic configuration of an imaging device according to a first embodiment.

FIG. 2 is a block diagram showing a schematic configuration of the imaging device according to the present embodiment. The imaging device according to the present embodiment includes an imaging element 184 for converting an optical image of a subject formed via the imaging optical system 152 into an electrical image signal and an imaging optical system 152 that forms the optical image of the subject on the imaging element 184. Also, the imaging device includes an optical axis 180 of the imaging optical system 152 and a diaphragm 181 for adjusting an amount of light passing through the imaging optical system 152. The diaphragm 181 is controlled by a diaphragm control unit 182. Further, an optical filter 183 limits a wavelength of light incident on the imaging element 184 and a spatial frequency transmitted to the imaging element 184. The imaging element 184 has a sufficient number of pixels, a signal reading speed, a color gamut, and a dynamic range to satisfy the Ultra High Definition Television standard.

A digital signal processing unit 187 compresses digital image data after performing various corrections on the image data output from the imaging element 184. A timing generation unit 189 is a generation unit that outputs various timing signals to the imaging element 184 and the digital signal processing unit 187, and a system control CPU 178 controls various calculations and the entire digital still motion camera. Also, the timing generation unit 189 and the system control CPU 178 function as a control unit.

An image memory 190 is a memory for temporarily storing image data, a display interface unit 191 is an interface unit for displaying a photographed image, and the display unit 153 is a display unit such as a liquid crystal display. A recording medium 193 is a removable recording medium such as a semiconductor memory for recording image data and additional data, and a recording interface unit 192 performs recording or reading on the recording medium 193. Also, an external interface unit 196 is an interface unit for communicating with an external computer 197 and the like. A printer 195 is a printer such as a small inkjet printer, and a print interface unit 194 is an interface unit for outputting a photographed image to the printer 195 and printing it. A wireless interface unit 198 is an interface unit for communicating with a computer network 199 such as the Internet. A switch input unit 179 is an input unit including the switch ST 154, the switch MV 155, and a plurality of switches for switching various modes.

Figure 3:
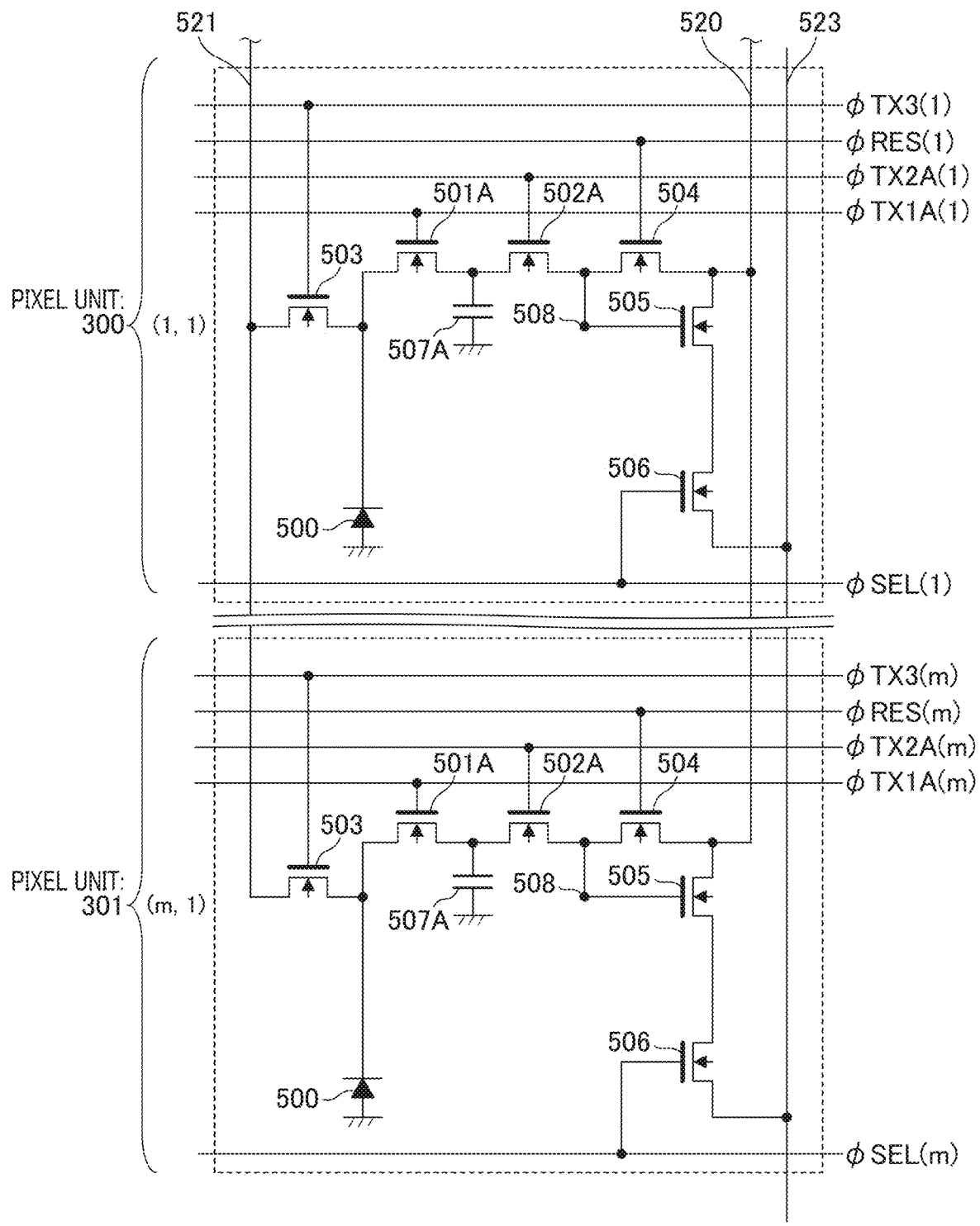
FIG. 3 is a partial circuit diagram of an imaging element according to the first embodiment.

FIG. 3 is a partial circuit diagram of the imaging element 184. Among a plurality of pixels of the imaging element 184, a pixel unit 300 of a first row and a first column (1,1) and a pixel unit 301 of an arbitrary m-th row and the first column (m, 1) are shown. Since configurations of the pixel unit 300 and the pixel unit 301 are the same, constituent elements are numbered with the same numbers. Also, a basic structure of the imaging element 184 having a signal holding unit may be a known structure.

Description of Configuration of Imaging Element and Process of Generating Image Signal In the circuit diagram of FIG. 3, one pixel unit 300 has a photodiode 500, a first transfer transistor 501A, a signal holding unit 507A, and a second transfer transistor 502A. The photodiode 500 and the signal holding unit 507A function as a photoelectric conversion unit and a signal holding unit. Further, the one pixel unit 300 has a third transfer transistor 503, a floating diffusion region 508, a reset transistor 504, an amplification transistor 505, and a selection transistor 506. The imaging element 184 in which a plurality of pixel units having the configuration described above are two-dimensionally arranged functions as an imaging element in which the pixel units having the photoelectric conversion units and the signal holding units are two-dimensionally arranged.

Also, the first transfer transistor 501A is controlled by a transfer pulse φTX1A, and the second transfer transistor 502A is controlled by a transfer pulse φTX2A. In addition, the reset transistor 504 is controlled by a reset pulse φRES, and the selection transistor 506 is controlled by a selection pulse φSEL. Further, the third transfer transistor 503 is controlled by a transfer pulse φTX3. Here, each control pulse is sent from a vertical scanning circuit (not shown). Furthermore, there are power supply lines 520 and 521 and a signal output line 523.

Figure 4:
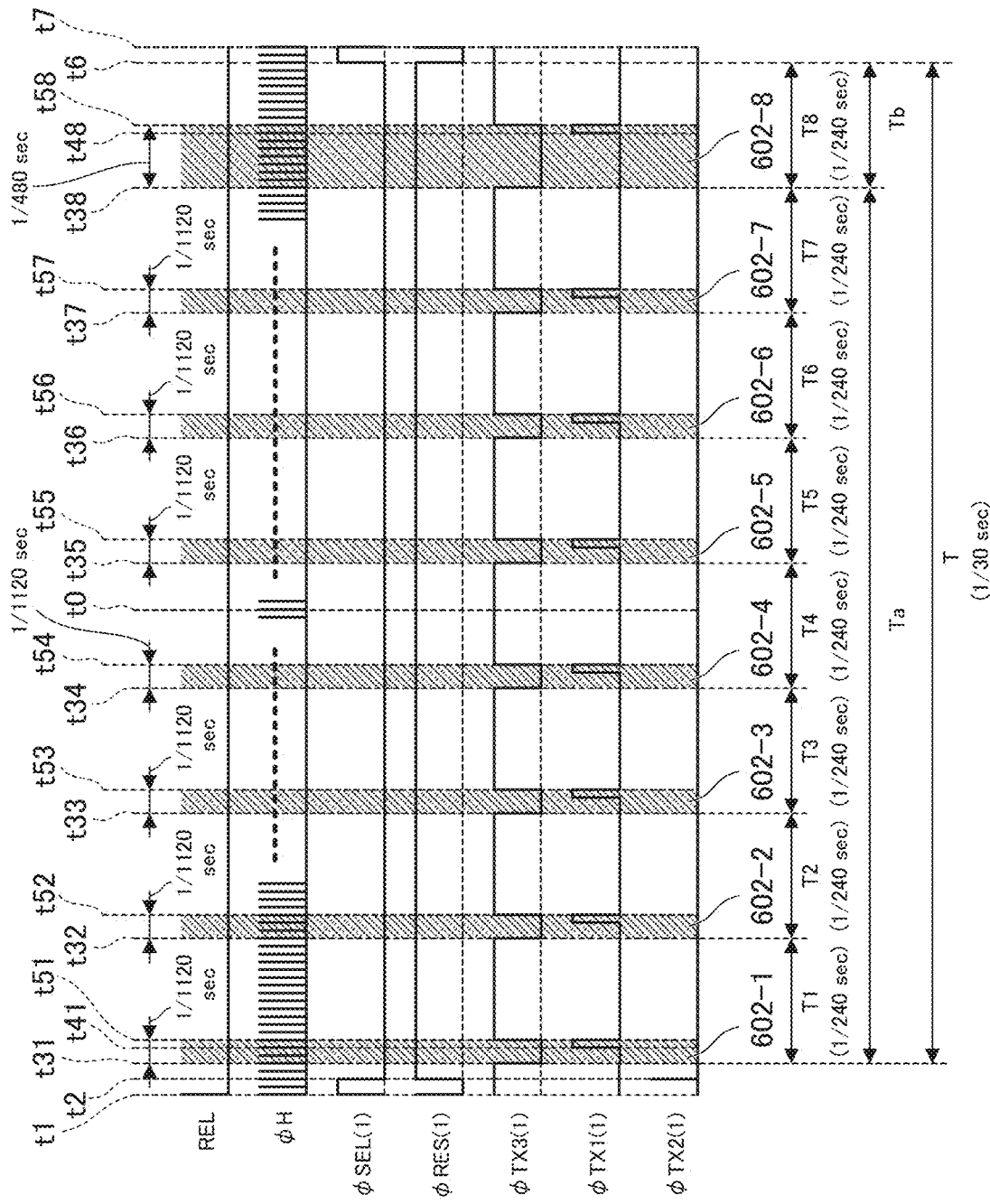
FIG. 4 is a timing chart of a driving sequence of the imaging element according to the first embodiment.

FIG. 4 is a timing chart showing a driving sequence of the imaging element 184, which corresponds to a case in which it is assumed that a shutter speed is set to 1/30 of a second to photograph a still image, and an image signal is obtained by adding 8 accumulations in one imaging period. Also, the imaging element 184 according to the present embodiment has pixel columns having a large number of rows in a vertical direction, and FIG. 4 shows a timing of the first row. In addition, these controls are scanned in the vertical direction by a horizontal synchronizing signal, whereby accumulation operations of all the pixels of the imaging element 184 are performed.

In FIG. 4, a rising time t1 of a release signal REL indicates a time when imaging of a still image of the imaging element 184 is started by a user's operation. Also, 1/30 of a second that is a time from t31 when accumulation of a signal charge is actually started to a time t6 when an image signal is read out corresponds to the shutter speed, which corresponds to one imaging period. A case in which, by adding 7 accumulations of 1/1120 of a second and 1 accumulation of 1/480 of a second, which are performed in one imaging period of 1/30 of a second, an exposure amount equivalent to one exposure of 1/120 of a second is obtained is shown as an imaging condition. In one imaging period, the imaging element 184 is controlled by the timing generation unit 189 and the system control CPU 178, which correspond to the control unit.

At the time t1, the level of the release signal REL becomes high, and at the same time, the level of a horizontal synchronizing signal φH becomes high. At a time t2, when the level of the transfer pulse φTX2(1) of the first row becomes high, the second transfer transistors 502A of the first row are turned on. At this time, since the level of the reset pulse φRES(1) in all rows has already become high and the reset transistor 504 has been turned on, the floating diffusion region 508 and the first signal holding unit 507A of the first row are reset. Also, at the time t2, the level of the selection pulse φSEL(1) of the first row is low.

At a time t31, when the level of the transfer pulse φTX3(1) of the first row becomes low, the third transfer transistor 503 is turned off, the reset of the photodiode 500 of the first row is released, and the photodiode 500 starts accumulating a signal charge. At the time t41, when the level of the transfer pulse φTX1(1) of the first row becomes high, the first transfer transistor 501A is turned on, and the signal charge accumulated in the photodiode 500 is transferred to the signal holding unit 507A holding the charge of the first row. At a time t51, when the level of the transfer pulse φTX1(1) of the first row becomes low, the third transfer transistor 501A is turned off, and the transfer of the signal charge accumulated in the photodiode 500 to the signal holding unit 507A ends. At the same time, the level of the transfer pulse φTX3(1) of the first row becomes high, the third transfer transistor 503 is turned on, the photodiodes 500 of the first row are reset, and the accumulation of signal charges in the photodiodes 500 is completed.

Here, a time period from the time t31 to the time t51 corresponds to one accumulation time of $1/1120$ of a second in one imaging period and is illustrated as an accumulation time 602-1 in an upward-sloping diagonally shaded region. Such an accumulation operation is performed discretely seven times, which are illustrated as accumulation times 602-1 to 602-7 in upward-sloping diagonally shaded regions. Also, control operations during the accumulation times 602-2 to 602-7 are the same as that of the accumulation rime 602-1, and the description thereof will be omitted. After the time t57 at which the accumulation during the accumulation time 602-7 ends, other accumulation operations and control operations are the same, but an accumulation operation with a different accumulation time is performed. In the figure, an accumulation time 602-8 between a time t38 and a time t58 is shown, and the accumulation time corresponds to $1/480$ of a second, which is longer than the other accumulation times. That is, in one imaging period, a plurality of discrete short-time exposures and at least one long-time exposure are performed. Then, by adding these eight total accumulations, an accumulation time equivalent to one exposure of $1/120$ of a second ($1/120$ s×7+$1/480$ s×1=$1/120$ s) is obtained.

At the time t6, when the level of the reset pulse φRES(1) of the first row becomes low, the reset transistor 504 of the first row is turned off, and a reset state of the floating diffusion region 508 is released. At the same time, when the level of the selection pulse φSEL(1) of the first row becomes high, the selection transistor 506 of the first row is turned on, and an image signal of the first row can be read. Further, an output in response to a change in potential of the floating diffusion region 508 is read out to the signal output line 523 via the amplification transistor 505 and the selection transistor 506 and is supplied to a reading circuit (not shown) and is output to the outside as the image signal of the first row.

Here, intervals between the start times t31 to t38 of the respective accumulation times 602-1 to 602-8 and a time period from the start time t38 of the accumulation time 602-8 to the time t6 when the image signal is output to the outside are defined as accumulation intervals T1 to T8, respectively. That is, a time period from a start of the accumulation of the signal charge to a start of the next accumulation or to the time when the image signal is output to the outside is defined as an accumulation interval. The accumulation intervals T1 to T8 are set to be equal to $1/240$ of a second.

Also, a period from the start time t31 of the accumulation time 602-1 to the start time t38 of the accumulation time 602-8 is defined as an accumulation period Ta, and the accumulation period from the start time t38 to the time t6 of the accumulation time 602-8 is defined as Tb. The accumulation period Ta corresponds to a first period, and the accumulation period Tb corresponds to a second period. A total accumulation period T including the accumulation period Ta and the accumulation period Tb is $1/30$ of a second, which corresponds to the shutter speed. The accumulation period Tb ($1/240$ of a second) and the accumulation time 602-8 ($1/480$ of a second) are shorter than the accumulation period Ta ($7/240$=$14/480$ of a second). That is, one imaging period is divided into the accumulation period Ta that is the first period and the accumulation period Tb that is the second period shorter than the first period. Further, in the first period, the signal charge is accumulated a plurality of times during the accumulation times 602-1 to 602-7, and in the second period, the signal charge is accumulated once during the accumulation time 602-8.

Here, the time from a start of accumulation to an end of accumulation in each of the accumulation intervals T1 to T8, that is, a ratio of the accumulation time, is defined as an accumulation time ratio R. In the accumulation period Ta, the accumulation time is $1/1120$ of a second in each of the accumulation intervals T1 to T7 of $1/240$ of a second, and the accumulation time ratio Ra is as follows.

$$Ra=(1/1120)/(1/240)=0.2142\ldots$$

In the accumulation period Tb, the accumulation time is $1/480$ of a second in the accumulation interval T8 of $1/240$ of a second, and the accumulation time ratio Rb is as follows.

$$Rb=(1/480)/(1/240)=0.5$$

That is, in one imaging period, the accumulation time ratio Ra of the accumulation intervals T1 to T7 during the accumulation period Ta is different from the accumulation time ratio Rb of the accumulation interval T8 during the accumulation period Tb. In addition, in one imaging period, the accumulation time ratio is changed by changing the accumulation time that is the time period from the start of accumulation to the end of accumulation. Further, the accumulation time ratio Rb of the accumulation period Tb in the second period is larger than the accumulation time ratio Ra of the accumulation period Ta in the first period. Also, a timing chart on a second row is executed in synchronization with a horizontal synchronizing signal φH immediately after the time t1. That is, the timing chart for all rows is started from the time t1 to the time t6. For example, the timing chart started by the horizontal synchronizing signal φH at a time t0 is defined as an m-th row Switch signals in this case can be represented as φSEL(n), φRES(m), φTX3(m), φTX1A(m), φTX1B(m), φTX2A(m), and φTX2B(m).

According to the above timing chart, 7 accumulations of $1/1120$ of a second are added to 1 accumulation of $1/480$ of a second during the imaging at the shutter speed of $1/30$ of a second, whereby the exposure amount equivalent to one exposure of $1/120$ of a second can be obtained. That is, the control operation for obtaining the image signal by performing the plurality of times of exposures and accumulations during the one imaging period mentioned above corresponds to the operation of outputting the image signal, which is generated by transferring the signal charge generated in the photoelectric conversion unit to the signal holding unit a plurality of times during the one imaging period controlled by the control unit, to the outside of the imaging element. In addition, although an example in which the total number of added accumulations is eight has been described in the present embodiment, the present embodiment is also applicable when other numbers are added, for example, 16, 32, 64, or the like.

In order to express a trajectory of a moving subject, it is necessary to continue the exposure for a certain period during which the subject moves in accordance with an amount of movement of which capture is desired. For that reason, it is necessary to shoot with a so-called slow shutter in which the shutter speed is set to be slow. In conventional slow synchronous imaging, when the slow shutter is performed in a bright environment, sensitivity is lowered or a diaphragm value is increased to avoid saturation of an amount of light. However, there is a risk that deterioration of image quality may occur due to increased noise or reduced resolution depending on settings of the sensitivity and the diaphragm value, or that limitations to imaging conditions such as a depth of field may occur depending on the setting of the diaphragm value. Also, although it is also possible to limit the amount of light by using an ND filter as another method, it is necessary to attach an external ND filter or to provide a switchable ND filter in the imaging device, which may cause an increase in size of the device.

In the present embodiment, since the set shutter speed is divided to perform accumulations, the exposure amount can be reduced as compared with the conventional case. That is, the same effect as the ND filter can be obtained without using the ND filter. Therefore, it is possible to reduce deterioration of image quality, limitations on imaging conditions, and increase in size of the device as compared with the conventional slow synchronous imaging.

Explanation of Effects

Figure 5A:
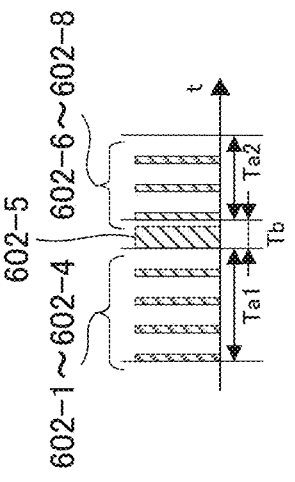
FIGS. 5A to 5G are explanatory diagrams showing an effect according to the first embodiment.
Figure 5B:
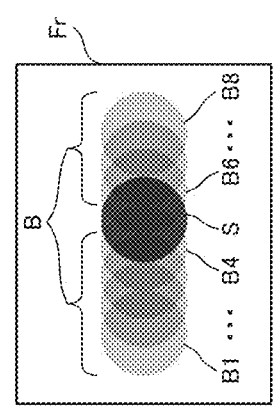
Figure 5C:
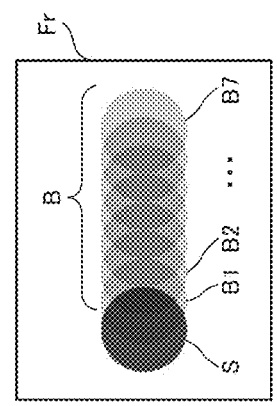

FIGS. 5A to 5G are explanatory diagrams showing effects of the present embodiment, in which FIG. 5A is a timing chart showing the accumulation times 602-1 to 602-8, FIG. 5B is a diagram showing a subject, and FIG. 5C is a diagram showing an image obtained by the imaging device. As shown in FIG. 5B, a subject O is moving at a constant velocity V in a direction of an arrow in a visual field Fi corresponding to a frame Fr obtained by the imaging device. A movement of the subject O in the visual field Fi mentioned herein occurs due to a change in a relative position between the subject O and the imaging device. Therefore, it may be caused by a movement of the subject O, may be caused by a movement of the imaging device, or may be caused by both movements.

If such a subject O is exposed in accordance with the timing chart as shown in FIG. 5A, an image as shown in FIG. 5C is obtained. That is, a motion blur image B obtained during the accumulation period Ta and a still image S obtained during the accumulation period Tb are superimposed in the frame Fr and recorded in the image. The motion blur image B corresponds to the accumulation times 602-1 to 602-7 and is formed by images B1 to B7 which are disposed to slightly deviate from each other in a moving direction of the subject O.

As described above, the accumulation period Ta during which the motion blur image B is formed is longer than the accumulation period Tb during which the still image S is formed. For that reason, the motion blur image B becomes a blurred image in the moving direction of the subject O, and the trajectory of the subject can be expressed. Also, as described above, the accumulation time 602-8 of the accumulation period Tb during which the still image S is formed is shorter than the accumulation period Ta during which the motion blur image B is formed. For that reason, blurring of the still image S is reduced as compared with the motion blur image B, and details of the subject can be expressed.

Since the accumulation time ratio Ra is small in the accumulation intervals T1 to T7 in which the accumulation times 602-1 to 602-7 occur, the accumulated amount of light is small, and the images B1 to B7 corresponding thereto become images with a low density. In addition, since the accumulation time ratio Rb is larger than Ra in the accumulation interval T8 in which the accumulation time 602-8 occurs, the accumulated amount of light is large, and the still image S corresponding thereto becomes an image with a higher density than the images B1 to B7. Further, the accumulation period Tb in which the still image S is formed is later in time than the accumulation period Ta in which the motion blur image B is formed. As a result, the motion blur image B that represents the trajectory of the subject is superimposed on the still image S that has a higher density and is imaged later in time than the motion blur image B. For that reason, while emphasizing the still image S that is the subject image immediately before the end of the total accumulation period T, the motion blur image B that is the past trajectory can be superimposed thereon, and thus the moving direction of the subject can be expressed. As a result, the details of the subject, the past trajectory, and the moving direction can be expressed at the same time, and effects equivalent to those of the trailing-curtain synchronization which is a kind of slow synchronous imaging can be obtained.

Although the accumulation time ratio is changed by setting the accumulation times 602-1 to 602-7 to $\frac{1}{1120}$ of a second and the accumulation time 602-8 to $\frac{1}{480}$ of a second in the present embodiment, the accumulation time may be freely changed to adjust each accumulation time ratio. For example, the accumulation time 602-8 may be further lengthened to increase the exposure amount, thereby further emphasizing the still image S. At this time, the accumulation times 602-1 to 602-7 are preferably relatively shortened to maintain the same overall accumulation time. Also, although the accumulation period Tb having a large accumulation time ratio is set at the end of the total accumulation period in the present embodiment, it may be set at any timing during the total accumulation period. Effects equivalent to those in the case of arbitrarily setting an emission timing of strobe light in the slow synchronous imaging are obtained.

Figure 5D:
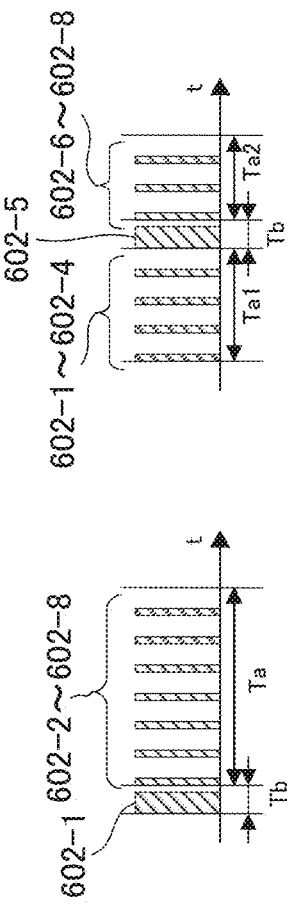
Figure 5E:
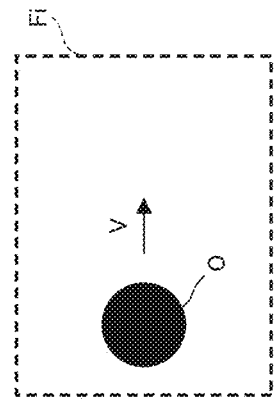

FIG. 5D is a timing chart of when the accumulation period Tb is set at the beginning of a total accumulation time. In the present setting example, the accumulation time 602-1 is $\frac{1}{480}$ of a second, and the accumulation times 602-2 to 602-8 are $\frac{1}{1120}$ of a second. The accumulation period Tb having a large accumulation time ratio is a period from the time t31 to a time t32 and is positioned at the beginning of the total accumulation period T. The accumulation period Ta having a small accumulation time ratio is a period from the time t32 to the time t6 and is a remaining period of the total accumulation period T. FIG. 5E is a diagram showing an image obtained by the imaging device in the present setting example. The still image S obtained during the accumulation period Tb is superposed on the motion blur image B obtained during the accumulation period Ta, so that the subject image immediately after the start of imaging and the trajectory of the subject thereafter can be expressed.

Figure 5F:
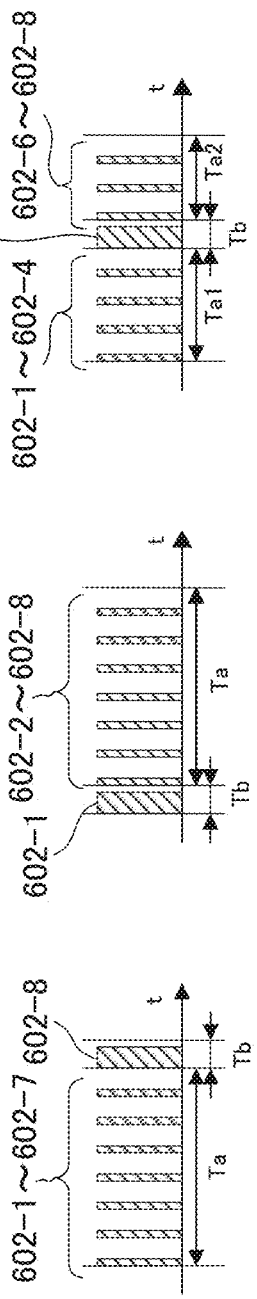
Figure 5G:
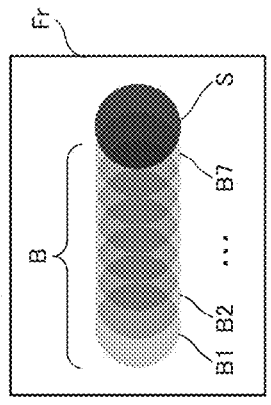

FIG. 5F is a timing chart of the case of setting the accumulation period Tb in the Middle of the total accumulation time. In the present setting example, the accumulation times 602-1 to 602-4 and 602-6 to 602-8 are 1/1120 of a second, and the accumulation time 602-5 is 1/480 of a second. The accumulation period Tb having a large accumulation time ratio is a period from a time t35 to a time 136 and is positioned in the middle of the total accumulation period T. The accumulation period Ta having a small accumulation time ratio includes a period Ta1 from the time t31 to the time t35 and a period Ta2 from the time t36 to the time 16 and is a remaining period of the total accumulation period T. FIG. 5G is a diagram showing an image obtained by the imaging device in the present setting example. The still image S obtained during the accumulation period Tb is superimposed on the motion blur image B obtained during the accumulation period Ta, so that the subject image in the middle of the total accumulation time and the trajectory of the subject before and after that can be expressed.

As described above, according to the present embodiment, details, a trajectory, and a moving direction of a subject can be expressed at the same time, thereby obtaining effects equivalent to those of the slow synchronous imaging using a stroboscope. In addition, according to the present embodiment, a stroboscope necessary for slow synchronous imaging, a spectroscopic unit such as a beam splitter, a plurality of imaging elements having different exposure conditions, an image synthesizing unit for synthesizing images output from the imaging elements, and the like are unnecessary. Therefore, it is possible to provide an imaging device in which a subject moving in a visual field can be freely expressed with a simple configuration.

Second Embodiment

Next, a second embodiment will be described, and the same parts as those in the first embodiment are denoted by the same reference numerals and the description thereof will be omitted. A main difference from the first embodiment is that the accumulation time ratio is controlled not by lengths of the accumulation times, but by lengths of intervals between the accumulation times.

Figure 6:
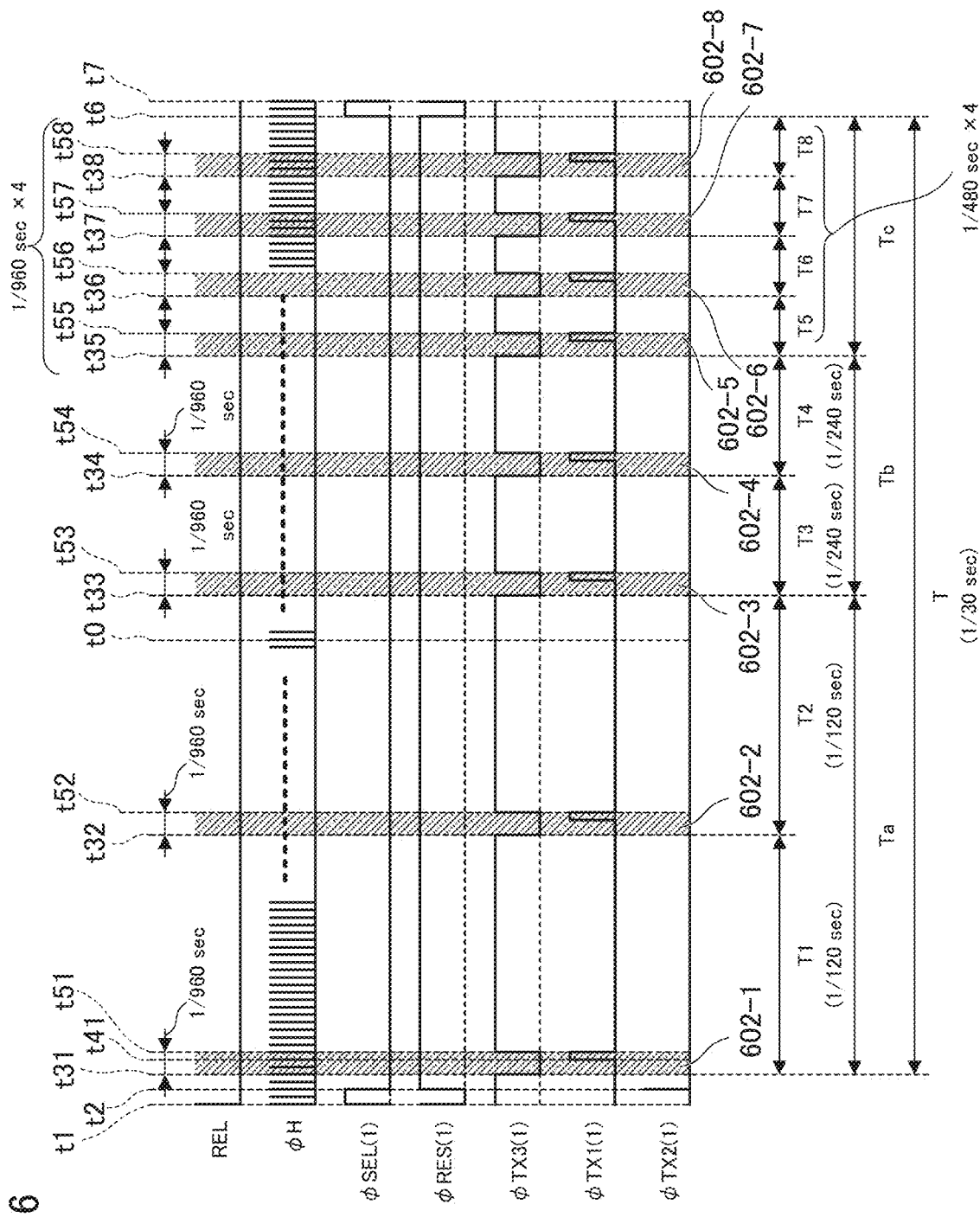
FIG. 6 is a timing chart of a driving sequence of an imaging element according to a second embodiment.

FIG. 6 is a timing chart showing a driving sequence of the imaging element 184, which correspond to the case in which it is assumed that a shutter speed is set to 1/30 of a second to photograph a still image, and an image signal is obtained by adding eight accumulations in one imaging period. The accumulation times 602-1 to 602-8 are all set equal to 1/960 of a second. By adding a total of eight accumulations, an exposure amount equivalent to one exposure of 1/120 of a second can be obtained. In addition, the accumulation intervals T1 to T8 are not all equal, T1 and T2 are set to 1/120 of a second, T3 and T4 are set to 1/240 of a second, and T5 to T8 are set to 1/480 of a second.

Here, a period from the time t31 to a time t33 is an accumulation period Ta, a period from the time t33 to the time t35 is an accumulation period Tb, and a period from the time t35 to the time t6 is an accumulation period Tc. That is, the total accumulation period T combining the accumulation periods Ta, Tb, and Tc that constitute one imaging period is divided into a period obtained by combining the accumulation period Ta and the accumulation period Tb, which is the first period, and the accumulation period Tc which is a second period shorter than the first period. When accumulation time ratios of the accumulation periods Ta to Tc are defined as accumulation time ratios Ra to Rc, respectively, the accumulation time ratios Ra to Rc are as follows.

$$Ra=(1/960)/(1/120)=0.125$$

$$Rb=(1/960)/(1/240)=0.25$$

$$Rc=(1/960)/(1/480)=0.5$$

That is, in the one imaging period, the accumulation time ratio Ra of the accumulation interval T1 to T2 during the accumulation period Ta, the accumulation time ratio Rb of the accumulation intervals T3 to T4 during the accumulation period Tb, and the accumulation time ratio Rc of the accumulation intervals T5 to T8 during the accumulation period Tc are different from each other. In addition, in the one imaging period, the accumulation time ratios are changed by changing the accumulation intervals. Further, the accumulation time ratio Rc in the second period is larger than the accumulation time ratios Ra and Rb in the first period.

Figure 7A:
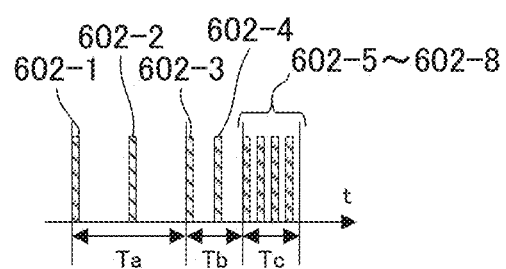
FIGS. 7A and 7B are explanatory diagrams showing an effect according to the second embodiment.
Figure 7B:
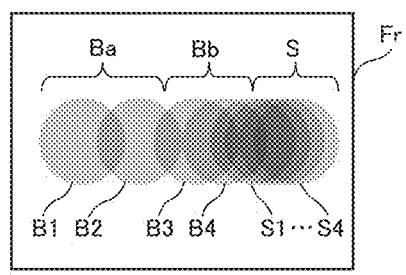

FIGS. 7A and 7B are an explanatory diagrams showing effects of the present embodiment, in which FIG. 7A is a timing chart showing the accumulation times, and FIG. 7B is a diagram showing an image obtained when an subject similar to that in FIG. 5B is imaged. As shown in FIG. 7B, the motion blur image B obtained in the first period, which is formed by a motion blur image Ba obtained in the accumulation period Ta and a motion blur image Bb obtained in the accumulation period Tb is superimposed on the still image S obtained in the second period and recorded on the image. Therefore, as in the first embodiment, the same effects as those of the trailing curtain synchronization, which is a kind of slow synchronous imaging, can be obtained.

In the present embodiment, the total accumulation period is divided into three periods Ta, Tb, and Tc, and the accumulation intervals are respectively changed to 1/120 of a second, 1/240 of a second, and 1/480 of a second for each period, thereby varying the accumulation time ratios. The present embodiment is not limited thereto, and the accumulation intervals may be freely changed to adjust the respective accumulation time ratios. For example, a motion blur image may be finely controlled by dividing the total accumulation period into two or four or more, or the accumulation intervals may be largely differentiated to further emphasizing the still image S. At this time, since the total accumulation time is maintained equally without changing the accumulation times 602-1 to 602-8, it is easy to control.

As described above, according to the present embodiment, as with the first embodiment, it is possible to provide an imaging device in which a subject moving in a visual field can be freely expressed with a simple configuration.

Third Embodiment

Next, a third embodiment will be described, and the same parts as those in the first embodiment are denoted by the same reference numerals and the description thereof will be omitted. A main difference from the first embodiment is that a still image is obtained by cutting out frames during moving image imaging.

Figure 8:
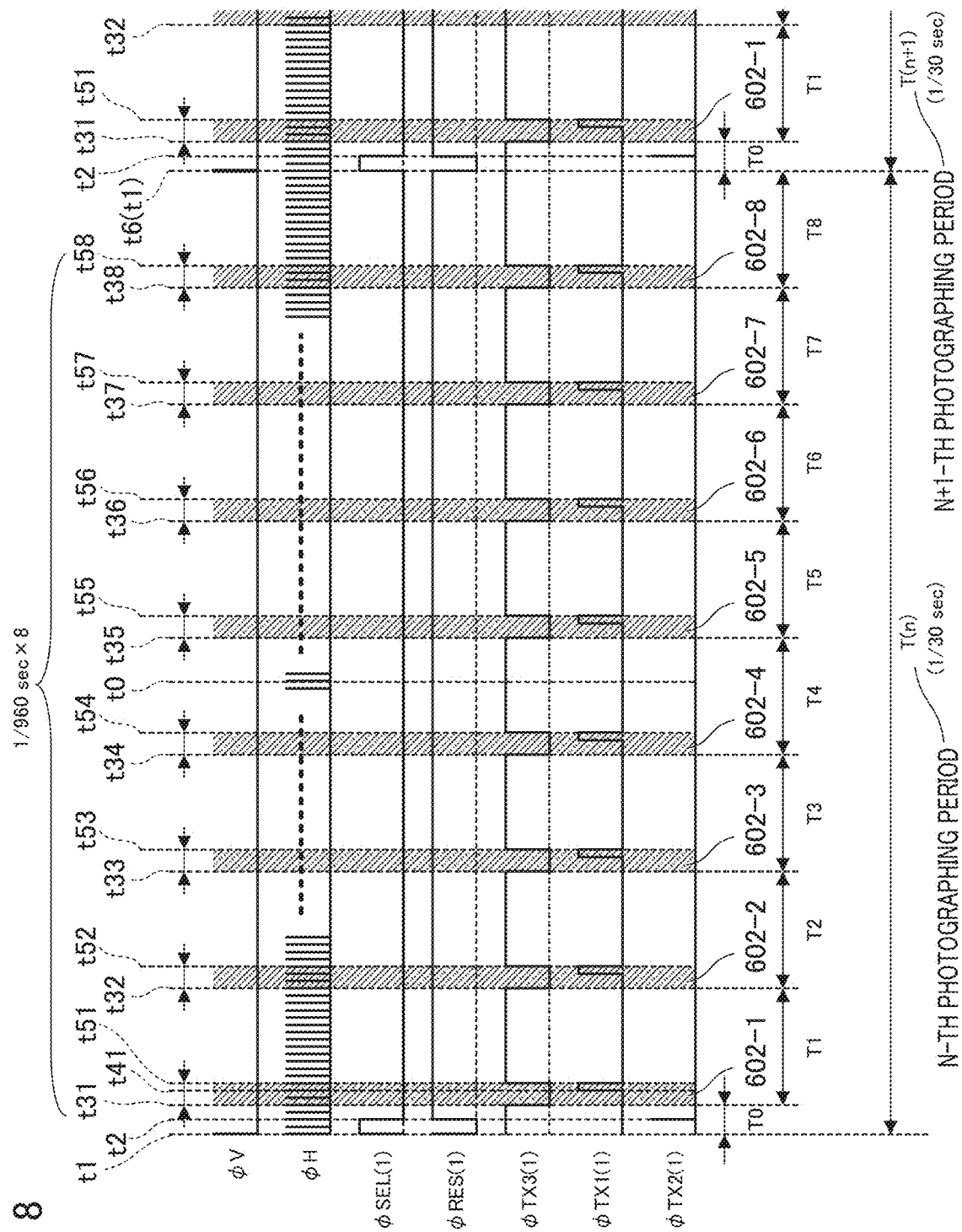
FIG. 8 is a timing chart of a first driving sequence according to a third embodiment.

FIG. 8 is a timing chart showing a first driving sequence of the imaging element 184, which corresponds to the case in which it is assumed that moving image imaging is performed under a condition of 30 fps, and an image signal is obtained by adding accumulations of 1/960 of a second eight times during 1/30 of a second which is one imaging period. The rising times t1 and t6 of a vertical synchronization signal φV are set for vertical synchronization signals at which the imaging period starts, and 1/30 of a second that are the time from t1 to t6 corresponds to one imaging period.

The n-th imaging period from a moving image start is represented as T(n). A plurality of image signals which are continuously generated for each imaging period T are stored as a moving image in the image memory 190 or the recording medium 193, displayed on the display unit 153, and output to the external interface unit 196 and the wireless interface unit 198.

First, at the time t1, the timing generation unit 189 sets the level of the vertical synchronization signal φV to high, and at the same time, the level of the horizontal synchronizing signal φH becomes high. The reset pulse φRES(1) of the first row becomes low level in synchronization with the time t1 when the levels of the vertical synchronizing signal φV and the horizontal synchronizing signal φH become high level. Then, the reset transistor 504 of the first row is turned off, and the reset state of the floating diffusion region 508 is released. At the same time, when the level of the selection pulse φSEL (1) of the first row becomes high, the selection transistor 506 of the first row is turned on, and the image signal of the first row can be read. Further, an output corresponding to a change in potential of the floating diffusion region 508 is read out to the signal output line 523 via the amplification transistor 505 and the selection transistor 506, and is supplied to a reading circuit (not shown) and Output to the outside as an image signal (a moving image) of the first row. Since a driving sequence from the time t2 to the time t51 is the same as that in the first embodiment, the description thereof will be omitted.

Here, a time period from the time t31 to the time t51 corresponds to one accumulation time of $1/960$ of a second of the moving image in the imaging period, and is illustrated as the accumulation time 602-1 in an upward-sloping diagonally shaded region. This accumulation operation is performed eight times discretely, which are shown as accumulation times 602-1 to 602-8 in upward-sloping diagonally shaded regions. In addition, by adding these eight times of accumulation, an accumulation time ($1/960$ s×8=$1/120$ s) equivalent to one accumulation is obtained. Also, since control operations during the accumulation times 602-2 to 602-8 are the same as that of the accumulation time 602-1, the description thereof will be omitted.

Next, at the time t6, the timing generation unit 189 sets the level of the vertical synchronizing signal φV to high, and at the same time, the level of the horizontal synchronizing signal φH to high, and the next imaging period is started. Then, image signals added as the accumulation times 602-1, 602-2, 602-3, and 602-4 of the moving image from the time t1 to the time t6 are output to the outside as image signals (a moving image) after the time t6. Here, an interval from the time t1 to the t31 is set as a reset period T0, and an interval from the time t31 to the time t38 and a time from time t38 to time t6 are set as accumulation intervals T1 to T8, respectively. The accumulation intervals T1 to T8 are set to be equal. Further, when the reset period T0 and the accumulation intervals T1 to T8 are combined, the imaging period T(n) is obtained. In the imaging period T(n), the accumulation time is $1/960$ of a second at each of the accumulation intervals T1 to T8, and the accumulation time ratio R is all equal.

Figure 9:
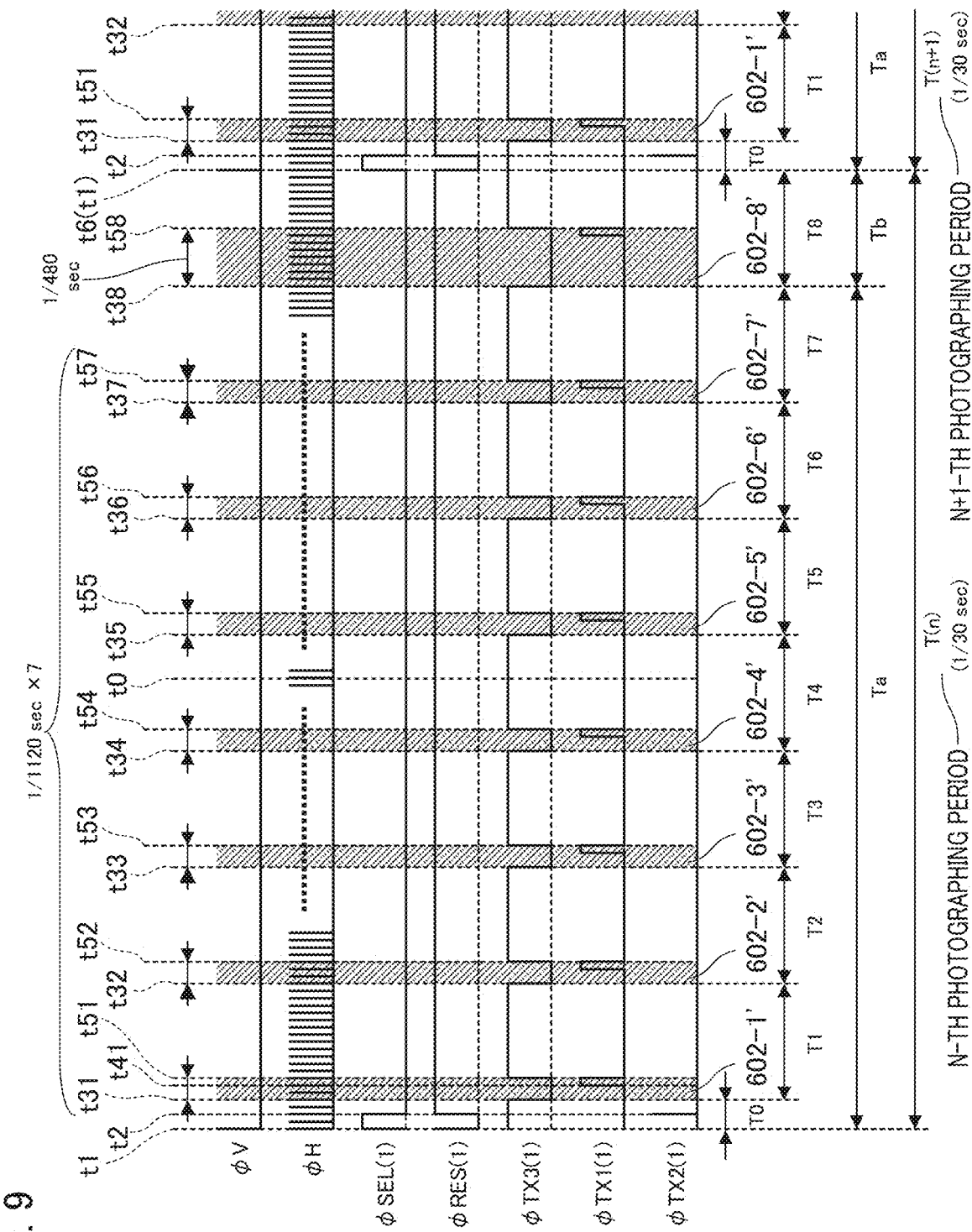
FIG. 9 is a timing chart of a second driving sequence according to the third embodiment.

FIG. 9 is a timing chart showing a second driving sequence of the imaging element 184. The nth imaging period from the moving image start is represented as T(n). The second driving sequence differs from the first driving sequence shown in FIG. 8 only in the accumulation time. Accumulation times 602-1' to 602-7' corresponding to the accumulation intervals T1 to T7 correspond to $1/1120$ of a second, respectively, and an accumulation time 602-8' corresponding to the accumulation interval T8 corresponds to $1/480$ of a second. Similar to the first driving sequence, by adding these eight times of accumulation, an accumulation time ($1/1120$ s×7+$1/480$ s=$1/120$ s) equivalent to one accumulation is obtained.

In the second driving sequence, the accumulation intervals T1 to T8 are equal, but the accumulation times 602-1' to 602-7' and the accumulation time 602-8' are different. That is, there are accumulation intervals with different accumulation time ratios in one imaging period. Here, a period from the time t1 to the time t38 is the accumulation period Ta, and a period from the time t38 to the time t6 is the accumulation period Tb. The accumulation period Tb and the accumulation time 602-8' are shorter than the accumulation period Ta. In the accumulation period Ta, the accumulation time is $1/1120$ of a second in each of the accumulation intervals T1 to T7, while in the accumulation period Tb, the accumulation time is $1/480$ of a second in the accumulation interval T8. Therefore, the accumulation time ratio of the accumulation period Tb is larger than the accumulation time ratio of the accumulation period Ta.

Figure 10A:
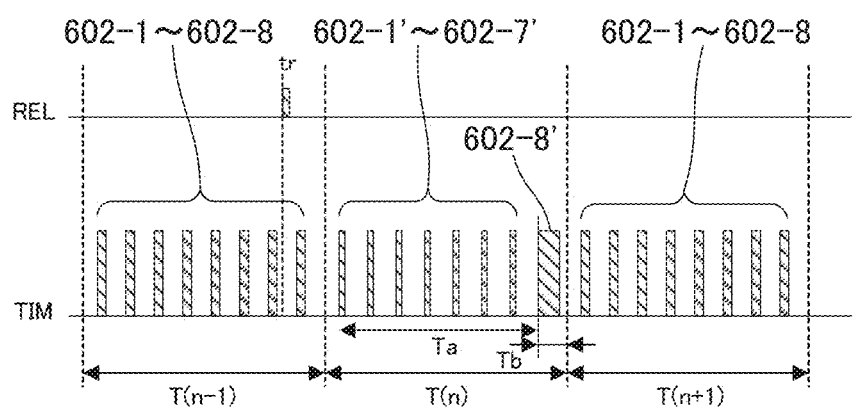
FIGS. 10A to 10C are explanatory diagrams showing an effect according to the third embodiment.
Figure 10B:
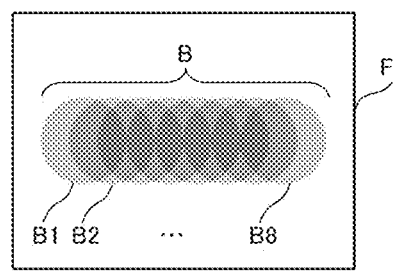
Figure 10C:
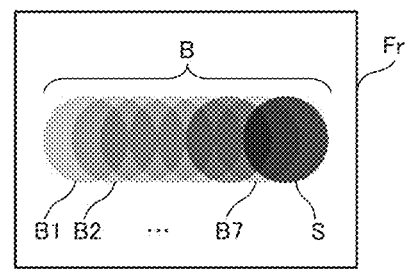

FIG. 10A to 10C are explanatory diagrams showing effects of the present embodiment, and FIG. 10A is a timing chart showing the release signal REL and the accumulation time TIM. In an imaging period before an imaging period T(n-1), an image is output through the first driving sequence. FIG. 10B is a diagram showing an image obtained when the same subject as that in FIG. 5B is imaged through the first driving sequence. In the frame Fr, a motion blur image B obtained during the imaging period is recorded as an image. The motion blur image B is an image that is uniformly blurred in the moving direction due to movement of the subject O. At this time, the obtained moving image is configured to obtain one image signal by adding short accumulation times set at substantially equal intervals during the imaging period of $1/30$ of a second, and thus high-definition moving image without the frame-by-frame feel can be obtained.

When the release signal REL is input at the time Tr in the imaging period T(n-1), an image is output by the second driving sequence in the next imaging period T(n). A single image signal generated in the imaging period T(n) is included in a plurality of image signals continuously generated in each imaging period T. Then, it is stored in the image memory 190 or the recording medium 193 as a part of a moving image, displayed on the display unit 153, or output to the external interface unit 196 or the wireless interface unit 198. Further, the single image signal generated in the imaging period T(n) is stored as a still image in the image memory 190 or the recording medium 193 separately from the moving image, displayed on the display unit 153, or output to the external interface unit 196 or the wireless interface unit 198.

FIG. 10C is a diagram showing an image obtained when the same subject as in FIG. 5B is imaged by the second driving sequence. Similar to FIG. 5C, the motion blur image B obtained in the accumulation period Ta is superimposed on the still image S obtained in the accumulation period Tb and recorded in an image in the frame Fr. Therefore, as in the first embodiment, the same effects as those of the trailing curtain synchronization, which is a kind of slow synchronous imaging, can be obtained.

In an imaging period after the imaging period T(n+1), the image is output by the first driving sequence. A high-quality moving image can be obtained as in the case before the imaging period T(n-1). In the present embodiment, it is possible to output a still image that has the same effects as those of the slow synchronous imaging while minimizing an influence on quality of a moving image.

As described above, in the present embodiment, as in the first embodiment, it is possible to provide an imaging device in which a subject moving in a visual field can be freely expressed with a simple configuration.

Fourth Embodiment

Next, a fourth embodiment will be described, and the same parts as those in the first embodiment are denoted by the same reference numerals and the description thereof will be omitted. A main difference from the first embodiment is that control of the accumulation time ratios is performed by both lengths of the accumulation times and lengths of the accumulation intervals.

Figure 11:
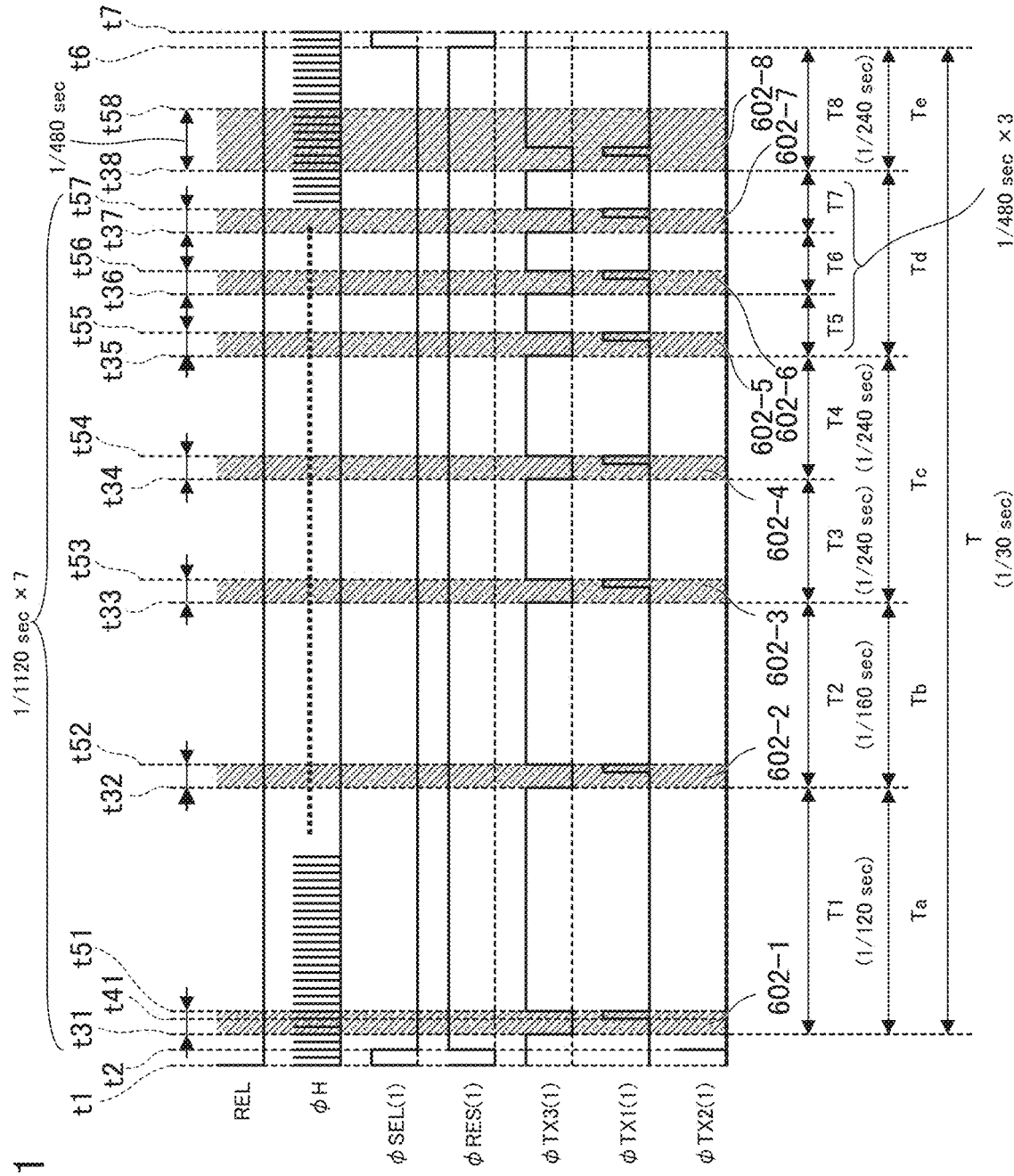
FIG. 11 is a timing chart of a first driving sequence according to a fourth embodiment.

FIG. 11 is a timing chart showing a first driving sequence of the imaging element 184. The accumulation times 602-1 to 602-7 are equally set to $1/1120$ of a second, and the accumulation time 602-8 is set to $1/480$ of a second. By adding a total of eight accumulations, an exposure amount equivalent to one exposure of $1/120$ of a second can be obtained. Further, the accumulation interval T1 is set to $1/120$ of a second, the accumulation interval T2 is set to $1/160$ of a second, the accumulation intervals T3 to T4 and T8 are set to $1/240$ of a second, and the accumulation intervals T5 to T7 are set to $1/480$ of a second.

Here, a time period from the time t31 to the time t32 is defined as an accumulation period Ta, a time period from the time t32 to the time t33 is defined as an accumulation period Tb, a time period from the time t33 to the time t35 is defined as an accumulation period Tc, a time period from the time t35 to the time t38 is defined as an accumulation period Td, and a time period from the time t38 to the time t6 is defined as an accumulation period Te. That is, the total accumulation period T obtained by adding the accumulation periods Ta to Te, which is one imaging period, is divided into a period obtained by adding the accumulation periods Ta to Td, which is a first period, and the accumulation period Te which is a second period shorter than the first period. When accumulation time ratios of the accumulation periods Ta to Te are respectively defined as accumulation time ratios Ra to Re, the accumulation time ratios Ra to Re are as follows.

$Ra=(1/1120)/(1/120)=0.107\ldots$ $Rb=(1/1120)/(1/160)=0.142\ldots$ $Rc=(1/1120)/(1/240)=0.214\ldots$ $Rd=(1/1120)/(1/480)=0.428\ldots$ $Re=(1/480)/(1/240)=0.5$ That is, one imaging period has accumulation intervals have different accumulation time ratios, and the accumulation time ratio Re in the second period is larger than the accumulation time ratios Ra to Rd in the first period.

Figure 12:
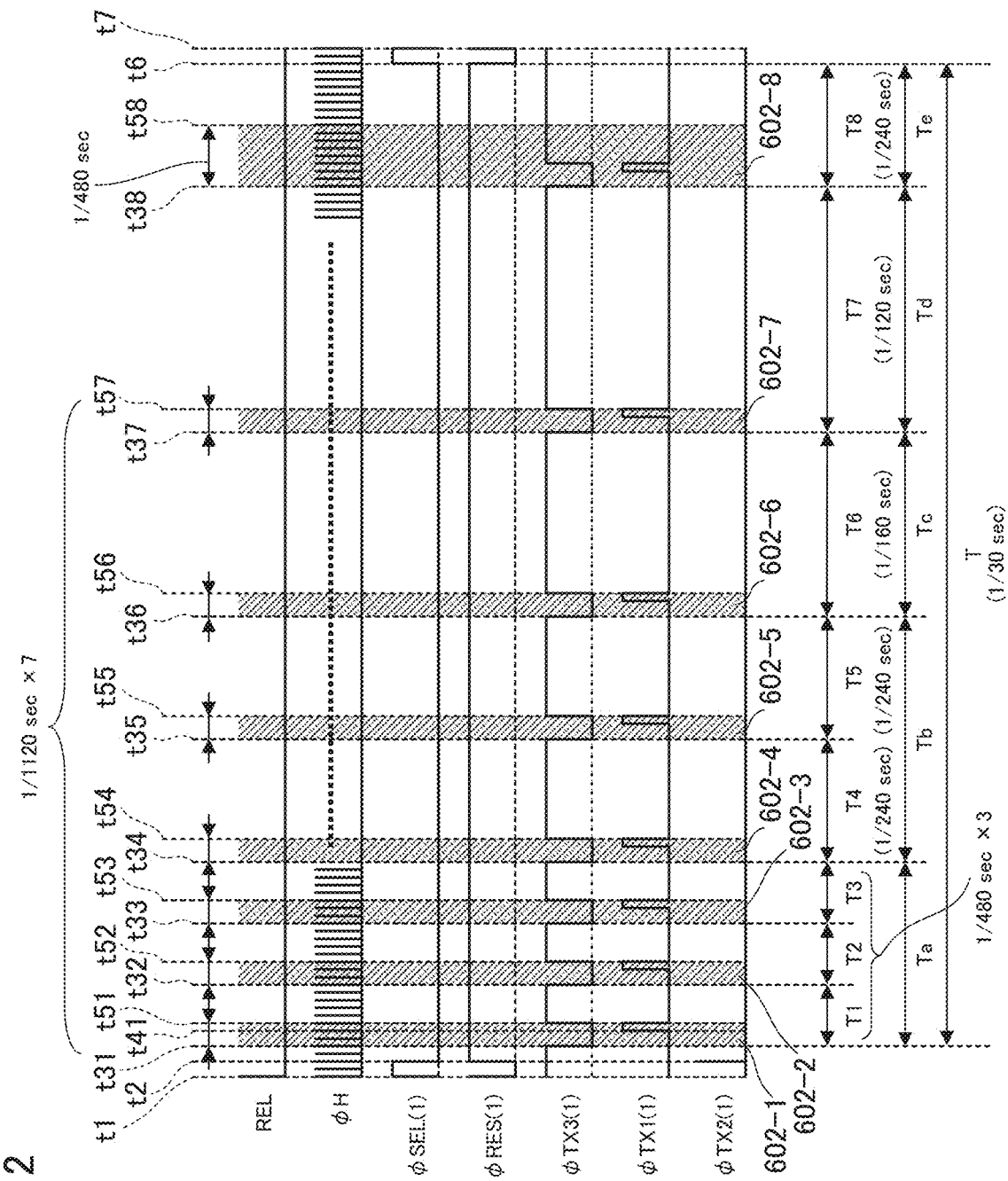
FIG. 12 is a timing chart of a second driving sequence according to the fourth embodiment.

FIG. 12 is a timing chart showing a second driving sequence of the imaging element 184. Similar to the first driving sequence, the accumulation times 602-1 to 602-7 are $1/1120$ of a second, and the accumulation time 602-8 is $1/480$ of a second. By adding a total of eight accumulations, an exposure amount equivalent to one exposure of $1/120$ of a second can be obtained. Unlike the first driving sequence, the accumulation interval T1 is set to $1/120$ of a second, the accumulation interval T2 is set to $1/160$ of a second, the accumulation intervals T3 to T4 and T8 are set to $1/240$ of a second, and the accumulation intervals T5 to T7 are set to $1/480$ of a second.

Here, a time period from the time t31 to a time t34 is defined as an accumulation period Ta, a time period from the time t34 to the time t36 is defined as an accumulation period Tb, a time period from the time t36 to a time t37 is defined as an accumulation period Tc, a time period from the time t37 to the time t38 is defined as an accumulation period Td, and a time period from the time t38 to the time t6 is defined as an accumulation period Te. That is, the total accumulation period T obtained by adding the accumulation periods Ta to Te, which is one imaging period, is divided into a period obtained by adding the accumulation periods Ta to Td, which is a first period, and the accumulation period Te which is a second period shorter than the first period. When accumulation time ratios of the accumulation periods Ta to Te are respectively defined as accumulation time ratios Ra to Re, the accumulation time ratios Ra to Re are as follows.

$Ra=(1/1120)/(1/480)=0.428\ldots$ $Rb=(1/1120)/(1/240)=0.14\ldots$ $Rc=(1/1120)/(1/160)=0.142\ldots$ $Rd=(1/1120)/(1/120)=0.107\ldots$ $Re=(1/480)/(1/240)=0.5$ That is, the accumulation time ratios in the accumulation periods Ta to Te are different from each other in one imaging period, and the accumulation time ratio Re in the second period is larger than the accumulation time ratios Ra to Rd in the first period.

Figure 13A:
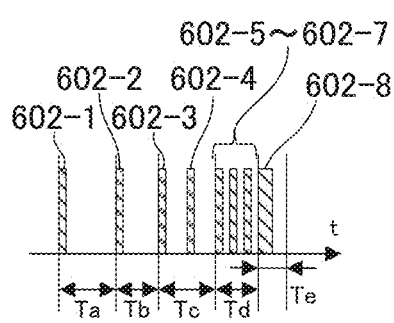
FIGS. 13A to 13D are explanatory diagrams showing an effect according to the fourth embodiment.
Figure 13C:
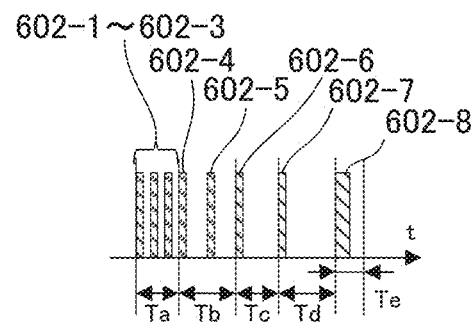
Figure 13B:
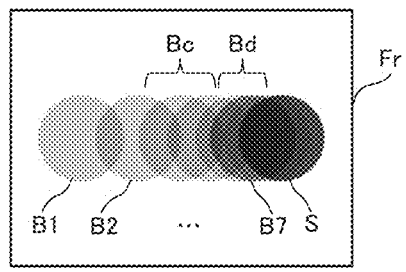
Figure 13D:
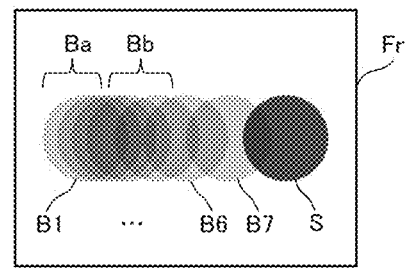

FIGS. 13A to 13D are explanatory diagrams showing effects of the present embodiment. FIG. 13A is a timing chart showing the accumulation times according to the first driving sequence, and FIG. 13B is a diagram showing an image obtained when the same subject as in FIG. 5B is imaged through the first driving sequence. FIG. 13C is a timing chart showing the accumulation times according to the second driving sequence, and FIG. 13D is a diagram showing an image obtained when the same subject as in FIG. 5B is imaged through the second driving sequence.

As shown in FIGS. 13B and 13D, in both the first driving sequence and the second driving sequence, the motion blur image B formed by the motion blur images B1 to B7 obtained in the first period is superimposed on the still image S obtained in the second period and recorded in the image. Therefore, as in the first embodiment, the same effects as those of the trailing curtain synchronization, which is a kind of slow synchronous imaging, can be obtained. Further, the still images S obtained in both the first driving sequence and the second driving sequence are the same.

In the first driving sequence, by shortening the accumulation intervals between the accumulation periods Ta to Td sequentially, the accumulation time ratios are set to gradually increase. Intervals between the motion blur image B1 obtained in the accumulation period Ta, the motion blur image B2 obtained in the accumulation period Tb, the motion blur images B3 and B4 obtained in the accumulation period Tc, and the motion blur images B5 to B7 obtained in the accumulation period Td become shorter in this order in the moving direction of the subject. As a result, as shown in FIG. 13B, the motion blur image Bc formed by the motion blur image B1, the motion blur image B2, and the motion blur images B3 to B4 and the motion blur image Bd formed by the motion blur images B5 to B7 are recorded as gradually darkened images. That is, the motion blur image B becomes an image that is light in a first half tend dark in a second half, and thus can be expressed as if the moving subject is decelerating. Also, since the motion blur image in the first half, which is a past trajectory, becomes thin, it is possible to create an expression in which an afterimage fades away with the lapse of time.

In the second driving sequence, by increasing the accumulation intervals between the accumulation periods Ta to Td sequentially, the accumulation time ratios are set to gradually reduce. For that reason, as shown in FIG. 13D, contrary to the first driving sequence, the motion blur image B becomes a dark image in the first half and a light image in the second half, and thus it is possible to express as if the moving subject is accelerating. In the present embodiment, by controlling both the accumulation times and the accumulation intervals in one imaging period, the motion blur image B can be freely controlled without affecting the overall exposure amount and the still image S.

As described above, according to the present embodiment, as in the first embodiment, it is possible to provide an imaging device in which a subject moving in a visual field can be freely expressed with a simple configuration.

Fifth Embodiment

Next, a fifth embodiment will be described, and the same parts as those in the fourth embodiment are denoted by the same reference numerals and the description thereof will be omitted. A main difference from the fourth embodiment is that the accumulation intervals are changed in according with movement of the subject within a visual field.

Figure 14A:
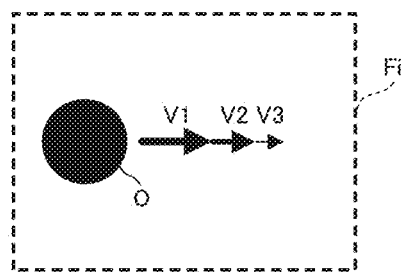
FIGS. 14A to 14D are explanatory diagrams showing an effect according to a fifth embodiment.
Figure 14B:
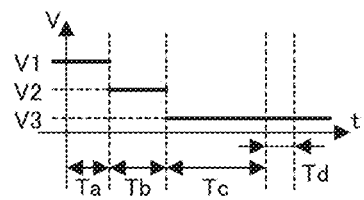
Figure 14C:
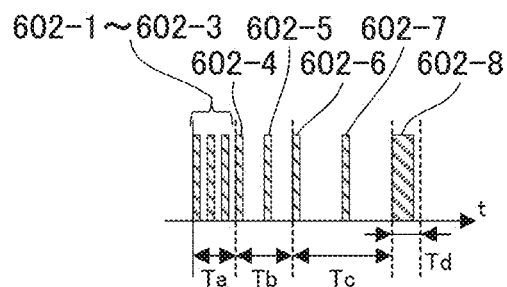
Figure 14D:
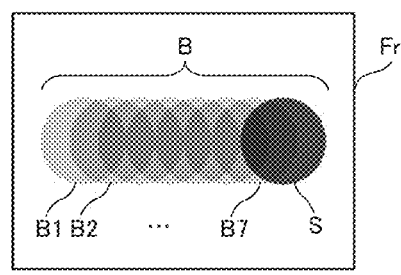

FIGS. 14A to 14D are explanatory diagrams showing effects of the present embodiment, in which FIG. 14A is a diagram showing a subject, FIG. 14B is a graph showing a speed of the subject, FIG. 14C is a timing chart showing the accumulation times, and FIG. 14D is a diagram showing an image obtained by the imaging device. As shown in FIG. 14A, the subject O is moving in a direction of arrows while decelerating in a visual field Fi corresponding to a frame Fr obtained by the imaging device. The movement of the subject O in the visual field Fi in the present embodiment occurs due to a change in a relative position between the subject O and the imaging device. Therefore, the movement of the subject O may be caused by movement of the subject O, may be caused by movement of the imaging device, or may be caused by both movements. As shown in FIG. 14B, a moving speed V of the subject O slows down during one imaging period and gradually changes to a slower speed such as V1 in the accumulation period Ta, V2 in the accumulation period Tb, and V3 in the accumulation periods Tc and Td.

The imaging device according to the present embodiment includes a detection unit that detects the movement of the subject O in the visual field Fi, and obtains the moving speed V of the subject O from an output thereof. The detection unit may be, for example, a surveying device such as LIDAR provided separately from the imaging element 184 or an image recognition device for calculating a speed of a subject on an image plane of the imaging element 184 from an image obtained by a second imaging element. In the case of moving image imaging, it may be a prediction circuit that predicts a speed of a subject in a current frame from a history of the speed of the subject calculated from images of past frames. Further, it may be a gyro that detects rotation of the imaging device due to a panning operation of a motor-driven universal head or a user, or a calculation circuit that calculates a speed of a subject on the basis of an output of an accelerometer or the like that detects movement of the imaging device.

In the present embodiment, the timing generation unit 189 and the system control CPU 178, which correspond to the control unit, control the imaging element 184 in accordance with the movement of the subject output by the detection unit, and perform exposure operations in accordance with the timing chart shown in FIG. 14C. Specifically, the accumulation intervals are controlled during the accumulation period for acquiring the motion blur image d the accumulation intervals are shortened when the moving speed V is high, and the accumulation intervals are lengthened when the moving speed V is slow.

In FIG. 14C, the accumulation periods Ta to Tc having small accumulation time ratios correspond to the first period in which the motion blur image B is acquired. In the first period, the speed of the subject is V1, which is relatively faster, during the accumulation period Ta in the first period and thus the accumulation interval is shorter, the speed of the subject is V2, which is an intermediate value, during the accumulation period Tb and thus the accumulation interval is medium, and the speed of the subject is V3, which is relatively slower, during the accumulation period Tb and thus the accumulation interval is longer. Further, the accumulation period Td having a large accumulation time ratio corresponds to the second period in which the still image S is acquired.

If exposure is performed in accordance with the timing chart shown in FIG. 14C, an image as shown in FIG. 14D is obtained. That is, in the frame Fr, the motion blur image B obtained during the accumulation period Ta is superimposed on the still image S obtained during the accumulation period Tb and recorded on the image. Therefore, as in the first embodiment, the same effects as those of the trailing curtain synchronization, which is a kind of slow synchronous imaging, can be obtained.

Further, the motion blur image B corresponds to the accumulation times 602-1 to 602-7 and is formed by the images B1 to B7 which are disposed to slightly deviate from each other in the moving direction of the subject O. As described above, since the accumulation intervals are shortened when the moving speed V is faster and the accumulation intervals are lengthened when the moving speed V is slower, the intervals of the images B1 to B7 are substantially equal. Therefore, a uniform motion blur image B can be obtained regardless of the moving speed of the subject O in the visual field Fi.

As described above, according to the present embodiment, as in the first embodiment, it is possible to provide an imaging device in which a subject moving in a visual field can be freely expressed with a simple configuration.

According to the present invention, it is possible to provide an imaging device in which a subject moving in a visual field can be freely expressed with a simple configuration.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

The invention claimed is:

1. An imaging device which acquires an image by dividing one imaging period into a plurality of periods for exposure to add and generate the image, comprising:
    an imaging sensor which includes a photoelectric conversion unit configured to generate a signal charge; and
    at least one processor and memory holding a program which makes the processor function as:
    a control unit configured to control an accumulation time of the signal charge generated in the photoelectric conversion unit,
    wherein the control unit changes the accumulation time in each period obtained by dividing the one imaging period according to a predetermined condition to generate an effect equivalent to slow synchronous imaging in the image.

2. The imaging device according to claim 1, wherein the control unit changes the accumulation time by providing a reset period in each period obtained by dividing the one imaging period.

3. The imaging device according to claim 1,
    wherein the one imaging period includes a first period having a shorter accumulation time and a second period having a longer accumulation time, and
    the control unit sets the accumulation times to include a plurality of the first periods and at least one second period in the one imaging period.

4. The imaging device according to claim 3, wherein the control unit sets the second period to a latter half of the one imaging period.

5. The imaging device according to claim 1, wherein the control unit sets the accumulation time in each period obtained by dividing the one imaging period to an equivalent time and changes a time interval between the set accumulation times.

6. The imaging device according to claim 3, wherein the control unit sets the accumulation times to include a plurality of the first periods and at least one of the second periods in the one imaging period in a case of imaging a still image during moving image imaging.

7. The imaging device according to claim 3, wherein the control unit includes a plurality of the first periods and at least one of the second periods in the one imaging period, and changes time intervals between accumulation times in the first period and the second period.

8. The imaging device according to claim 3, wherein the processor further function as a detection unit configured to detect movement of a subject within a visual field,
    wherein the control unit sets the first period, the second period, and a time interval between the accumulation times in the first period and the second period in accordance with the movement of the subject output by the detection unit.

9. The imaging device according to claim 1, wherein the one imaging period is an imaging period for a moving image.

10. An imaging device which acquires an image by dividing one frame period into a plurality of periods for exposure to add a signal obtained through the dividing and exposure and generate the image, comprising:
    an imaging sensor which includes a photoelectric conversion unit and a holding unit configured to hold a signal charge generated in the photoelectric conversion unit; and
    at least one processor and memory holding a program which makes the processor function as:
    a control unit configured to control an accumulation time of the signal charge generated in the photoelectric conversion unit according to a predetermined condition to generate an effect equivalent to slow synchronous imaging in the image,
    wherein the control unit performs control including a first accumulation time at a predetermined interval and a second accumulation time longer than the first accumulation time in each period obtained by dividing the one frame period.

11. A method of controlling an imaging device which includes an imaging sensor having a photoelectric conversion unit configured to generate a signal charge, and acquires an image by dividing one imaging period into a plurality of periods for exposure to add and generate the image, comprising:
    controlling an accumulation time of the signal charge generated in the photoelectric conversion unit,
    wherein, in the controlling, the accumulation time in each period obtained by dividing the one imaging period is changed according to a predetermined condition to generate an effect equivalent to slow synchronous imaging in the image.

12. The imaging device in accordance with claim 1, wherein the generated image includes a still image of an object and a motion blur image of the object.

13. The imaging device in accordance with claim 1, wherein the accumulation time in each period obtained by dividing the one imaging period is changed according to movement of an object to be captured.

* * * * *